(12) United States Patent
Schlipf et al.

(10) Patent No.: US 8,252,406 B2
(45) Date of Patent: Aug. 28, 2012

(54) CARRIER FOIL

(75) Inventors: Michael Schlipf, Heidenheim (DE); Katja Widmann, Aalen (DE)

(73) Assignee: ElringKlinger AG, Dettingen (DE)

( * ) Notice: Subject to any disclaimer, the term of this patent is extended or adjusted under 35 U.S.C. 154(b) by 105 days.

(21) Appl. No.: 12/658,802

(22) Filed: Feb. 16, 2010

(65) Prior Publication Data

US 2010/0221529 A1   Sep. 2, 2010

Related U.S. Application Data

(63) Continuation of application No. PCT/EP2008/004431, filed on Jun. 4, 2008.

(30) Foreign Application Priority Data

Aug. 24, 2007   (DE) .................. 10 2007 040 098

(51) Int. Cl.
*B32B 15/08* (2006.01)
*B32B 15/20* (2006.01)
*B32B 33/00* (2006.01)

(52) U.S. Cl. ........ 428/141; 428/212; 428/336; 428/422; 428/457; 428/901

(58) Field of Classification Search .................. None
See application file for complete search history.

(56) References Cited

U.S. PATENT DOCUMENTS

| | | | |
|---|---|---|---|
| 4,519,969 A | 5/1985 | Murakami | ................. 264/210.7 |
| 5,006,382 A | 4/1991 | Squire | ........................ 428/35.7 |
| 2004/0072935 A1* | 4/2004 | Blong et al. | ................. 524/379 |
| 2008/0035266 A1* | 2/2008 | Danziger | ...................... 156/150 |

FOREIGN PATENT DOCUMENTS

| | | |
|---|---|---|
| EP | 0 291 629 | 11/1988 |
| WO | WO 01/60911 | 8/2001 |
| WO | WO 03/078481 | 9/2003 |
| WO | WO 2005/084940 | 9/2005 |

OTHER PUBLICATIONS

M. Collaud Coen, et al., Modification of the micro- and nano- topography of several polymers by plasma treatments, Applied Surface Science 207, 2003, pp. 276-286.

S. Ebnesajjad, Fluoroplastics, vol. 1, Non-Melt Processible Fluoroplastics, Verlag William Andrew Publishing, 2000.

* cited by examiner

*Primary Examiner* — Ramsey Zacharia

(57) ABSTRACT

In order to produce a carrier foil for printed circuit boards, which is particularly suitable for high component densities, it is proposed that said carrier foil be produced from a polymer material comprising a thermoplastically processable, substantially fully fluorinated plastics material.

12 Claims, 1 Drawing Sheet

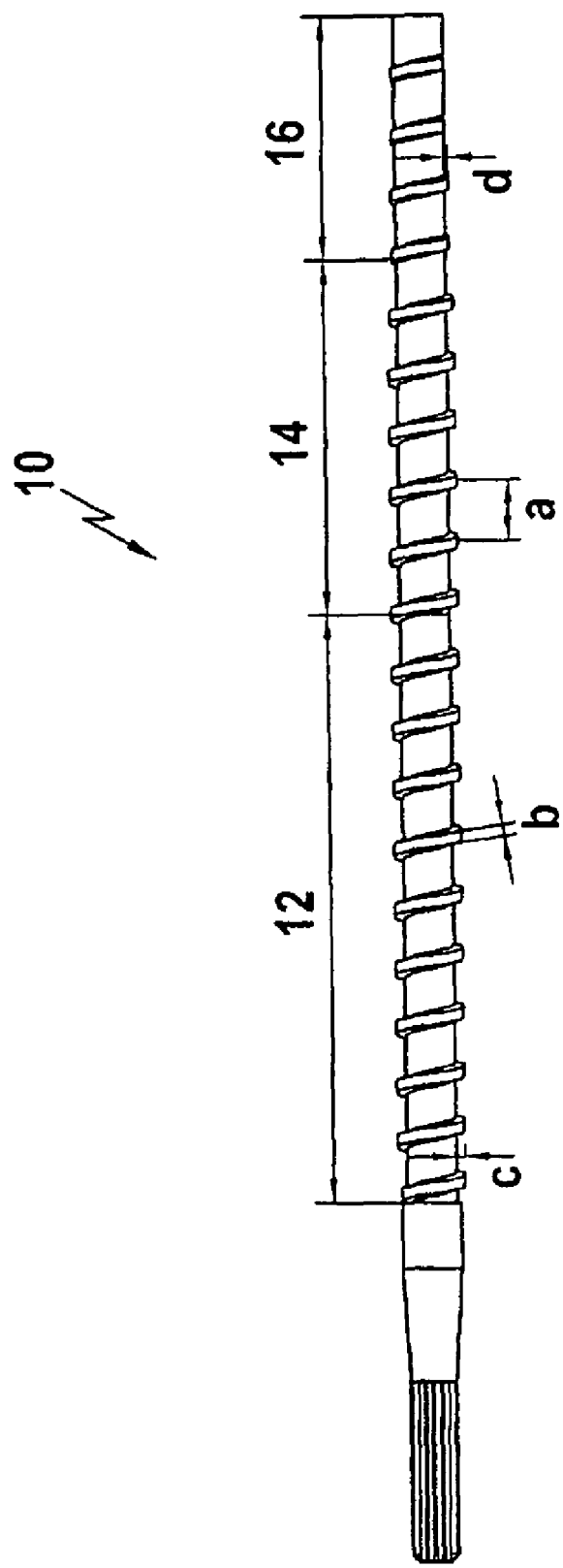

CARRIER FOIL

This application is a continuation of International Application No. PCT/EP2008/004431 filed Jun. 4, 2008, which claims priority of German application No. 10 2007 040 098.7 filed Aug. 24, 2007.

FIELD OF THE INVENTION

The invention relates to a carrier foil for a flexible printed circuit board with one or more foil layers, which are produced from a polymer material.

BACKGROUND OF THE INVENTION

Conventional printed circuit boards of the FR 4-type require comparatively large layer thicknesses for good strength values. In conjunction with the relatively poor dielectric properties, they allow only a low component density of the electronic components to be assembled.

Conventional standard printed circuit boards cannot be used for many demanding applications in the modern world of electronics, for example mobile telephones, laptops or mobile electronic game devices and in proximity radar devices in cars.

High-performance printed circuit boards based on PTFE-coated fibre glass, optionally with a PTFE foil lamination are generally used in applications of this type. In addition, high-performance polymer foils are used, which are produced based on polyethylene, liquid crystalline polymers (LCP), polyetheretherketone (PEEK), polyetherimide (PEI) or polyimide (PI). High-power printed circuit boards of this type, also in the form of flexible foils, have many improvements in comparison to the standard printed circuit boards (called FR 4-printed circuit boards in brief), but cannot, however, satisfactorily meet all requirements.

Printed circuit boards based on polymer and high-power polymer foils may be very thin and, owing to their flexibility, allow innovative installation situations, but even they still have significant drawbacks.

The PTFE coated glass fibres, with a relative dielectricity constant $\epsilon_r$ of about 2.4, do not have the optical dielectric properties of PTFE.

Air inclusions in the PTFE-coated glass fibres, so-called microvoids, may lead to defects when a voltage is applied. The production of microvoids is due to the special coating method which requires a repeated immersion of the fibre glass in a PTFE dispersion with subsequent drying and sintering. Residual contents of the emulsifiers contained in the PTFE dispersion and traces of their decomposition products remain in the PTFE-coated fibre glass printed circuit board and impair the performance potential of the material PTFE in this application. In particular, these residues influence the dielectric loss factor (tan $\delta$) and the relative dielectricity constant $\epsilon_r$.

PTFE-coated fibre glass has a comparatively rough surface as in the typically used application quantities the fibre glass still shows on the surface.

Rough surfaces, such as occur, in particular in the PTFE-coated glass fibres, after the application of the copper layer in conjunction with a so-called skin effect, lead to a comparatively high dielectric damping coefficient (high tan $\delta$). Skin effect is taken to mean the fact that the (negative) charge carriers responsible for the current flow, because of their mutual repulsion, preferably flow on the surface of an electric conductor. The skin effect increases with increasing frequency. The demands on the surface quality also increase in the same direction.

Rough surfaces are also determined in PTFE foils produced by means of a peeling process. The roughness is produced here, in particular by longitudinally oriented grooves, in relation to the peeling process, originating from the peeling knife. The mechanical properties of PTFE foils produced by means of a peeling process therefore frequently differ when comparing the longitudinal and transverse values. The values determined in the transverse direction, in particular the values for tensile strength and elongation at break, may be up to 50% lower than the values determined in the longitudinal direction.

Printed circuit boards, which are produced based on polymers and high-performance polymers, are typically distinguished by good surface properties. However, the tendency of many polymers to absorb water in the course of time in direct contact with water or else air humidity has a negative effect on the properties of the printed circuit boards. The performance data of the original dry state continuously decrease during the service life because of the continuing absorption of water. The relatively pronounced tendency of the polyimide (PI) to absorb water proves to be particular negative for printed circuit board applications. In the PI-based carrier foils, a Cu foil is conventionally rolled onto the PI-carrier foil, which, for reasons of process technology, makes layer thicknesses of 18 µm and above necessary. If the provided use of the printed circuit board requires lower Cu layer thicknesses, the superfluous Cu layer thickness has to be removed again by a complex etching process in a subsequent process step.

Liquid crystalline polymers (LCP) are distinguished by a strongly reduced tendency to absorb water. In the most favourable case, in comparison with PI, a water absorption which is reduced by up to a factor of about one hundred can be observed. However, LCPs are comparatively brittle, and in particular in applications with vibration loading, mechanical damage or even a printed circuit board break may easily occur. Moreover, LCPs are very expensive materials and therefore limited to niches in printed circuit board construction.

SUMMARY OF THE INVENTION

The object of the invention is to propose a carrier material for printed circuit boards, which avoids the aforementioned problems and, in particular, can be provided at economical costs.

This object is achieved by a carrier foil according to claim 1.

DETAILED DESCRIPTION OF THE INVENTION

Thermoplastically processable plastics materials are taken to mean materials of the type which have a melt flow index (MFI), which is different from zero (ASTM Test D1238-88 at 372° C. and a load of 5 kg at a maximum extrudate collecting time of 1 hour).

The thermoplastically processable, substantially fully fluorinated plastics material used according to the invention can be processed, in particular by the extrusion method, into foils, so that the carrier foil according to the invention can be produced in a simple process and with very good surface properties.

Thermoplastically processable PTFE is preferably used as the fully fluorinated thermoplastic plastics material. A large number of such materials is described, for example, in WO 01/60911 and WO 03/078481.

TFE-copolymers come into consideration here, in particular, in which the comonomer fraction is less than 3.5 mol %, as the PTFE properties are substantially retained here and a thermoplastic processing is nevertheless possible. The comonomer fraction is more preferably limited to less than about 3 mol % and comonomer fractions of less than about 1 mol %, for example 0.5 mol % or less are still further preferred.

Preferred comonomers, which, on the one hand, ensure good thermoplastic processability and, on the other hand, leave the material properties substantially unchanged compared to PTFE, are hexafluoropropylene, perfluoroalkylvinylether, perfluoro-(2,2-dimethyl-1,3-dioxol) and chlorotrifluoroethylene.

Apart from the TFE-copolymers, polymer blends of PTFE and one or more thermoplastically processable plastics materials are used as fully fluorinated plastics material to be used according to the invention.

These further plastics material are selected, in particular, from the group of PTFE micropowders. These are PTFE types with, in comparison to high-molecular (standard) PTFE, a low molecular weight and low melt viscosity. They are typically produced either by emulsion polymerisation, by thermomechanical degradation of high-molecular PTFE in the extruder or by beam degradation of high-molecular PTFE, followed by a grinding process.

The property differences of high-molecular (standard) PTFE and low-molecular PTFE micropowders can be shown as follows, for example (cf. S. Ebnesajjad, Fluoroplastics, Vol. 1, Non-Melt Processable Fluoroplastics, Publishers William Andrew Publishing, 2000):

| Product | Molecular weight | Melt viscosity at 380° C. in Pa · s |
|---|---|---|
| Standard PTFE | About $10^6$-about $10^8$ | About $10^{10}$-about $10^{13}$ |
| Micropowder | About $10^4$-about $10^6$ | About $10^2$-about $10^5$ |

Examples of such polymer blends can be found in the published applications WO 01/60911 and WO 03/078481.

The carrier foils according to the invention, with a relative dielectricity constant $\epsilon_r$ of about 2.1, have a significantly better value than PTFE-coated fibre glass.

The strongly pronounced hydrophobicity of the fully fluorinated plastics materials is the cause of an extremely low water absorption of the carrier foils according to the invention during the service life of the printed circuit boards. As a result, the original material and printed circuit board properties are virtually completely retained over a long period, even in a damp environment.

The plastics materials to be used according to the invention are distinguished because of their special molecular structure by very good ageing resistance, even at high temperatures and under the action of light, in particular UV-light, and a low tendency to crack formation and brittleness.

The fact that in the fully fluorinated plastics materials to be used according to the invention no abrupt changes in the properties of the material are to be expected over very broad temperature ranges through to the temperature of liquid helium, allow use of the carrier foils according to the invention and printed circuit boards manufactured therefrom even in electronic applications which require helium cooling to achieve the smallest resistances.

The excellent surface properties and outstanding dielectric properties result in the lowest damping values in many electronic applications and allow use in conjunction with higher signal frequencies than is the case with conventional polymer and high-performance polymer-based printed circuit boards.

In combination with the extremely low moisture absorption over long periods of time, applications in the automotive sector, such as, for example, high-frequency proximity radar and others, are opened up to the carrier foils according to the invention.

The carrier foils according to the invention can also be produced multi-layered with low outlay—a particular advantage in highly integrated circuits with a high component density.

The carrier foil according to the invention, or one of the layers thereof, preferably has an Cu lamination, it being possible to use the carrier foil according to the invention, in particular, as a substrate for the lamination. It is therefore possible to go over to thinner Cu layers than was previously the case in the technique of rolling Cu foils onto polymer foils.

The thickness of the Cu layer may vary within wide ranges. Typically, it is between 1 μm and 20 μm.

One of the advantages of the present invention lies in the possibility of producing particularly thin Cu layers with a high adhesiveness and high degree of uniformity.

Foils produced by the chill roll method are particularly advantageous. The chill roll side and the opposing side of the foil have slightly different surface roughnesses. By selecting the suitable side as the side to be laminated (conductor side), this allows an optimum to be found between very good adhesiveness of the conductive copper layer and low damping values even in high frequency applications.

The polymer material of the carrier foil according to the invention preferably has an amorphous fraction, which is about 50% by weight or more.

This measure can also easily be taken into account in the production of the foil by the chill roll method.

The arithmetic average roughness of the layer of the carrier foil on a first surface preferably has a value of about 1 μm or less and about 0.8 μm or less on the opposing side (chill roll side).

In further preferred carrier foils according to the invention, care is taken that the surface roughness, expressed by the arithmetic average roughness of a layer of the carrier foil on a first surface, is about 0.6 μm or less, in particular about 0.3 μm or less and, on the opposing surface (chill roll side), about 0.5 μm or less, in particular about 0.25 μm or less. Foils in which the arithmetic average roughness of the chill roll side is about 0.2 μm or less are particularly preferred.

Furthermore, preferred carrier foils have surfaces of the individual layers with a roughness depth of about 2.5 μm or less, in particular 2 μm or less.

A measuring device from the company Mahr, for example, which is marketed under the trade name Marsurf XR20, is suitable for determining the above-mentioned surface properties.

The present invention furthermore relates to a method for producing a carrier foil according to the invention as defined in more detail below.

The carrier foils produced according to the method of the invention can be especially well provided with a Cu lamination with good adhesive strength.

Methods for the electrodeposition (chemically or electrochemically) of the Cu layer are particularly preferred for the lamination.

It is recommended that the surface to be laminated of a layer of the carrier foil be activated before the electrodeposition of the Cu layer. The activation may include a roughening of the surface in order to improve the mechanical adhesive bond between the Cu layer and the layer surface.

The roughening of the surface may include the treatment thereof by means of ion beam or ion track technology, and/or plasma beam and/or electron beam and/or laser beam, which results in a nanostructuring of the surface.

For the Cu lamination, a nanostructured transition layer containing nanocomposites is firstly produced, preferably directly following the roughening of the surface and more preferably by means of ion and/or plasma methods. A copper starting layer is then applied thereon by means of vacuum coating. The main part of the copper layer is then applied to this, in particular galvanically, i.e. in a chemical or electrochemical process.

Particularly preferred methods of this type for surface treatment and subsequent Cu lamination are described in detail in WO 2005/084940, regarding their suitability for the production of carrier foils according to the invention. Compared to the substrates mentioned in WO 2005/084940, in particular peeled PTFE foils, the carrier foil according to the present invention has the advantage of a significantly improved surface quality, which is shown by a lower arithmetic average roughness and a lower roughness depth.

The desired roughening in the nm-range as described at another point is to be distinguished from the roughness of the surface. The desired roughness leads to better mechanical anchoring of the Cu layer on the surface without noticeably impairing the damping properties.

Alternatively, the roughening may also take place by chemical etching.

The provision of a surface structure in the nm range is meant here, in particular, by roughening.

The lamination of a surface of a layer of the carrier foil may alternatively comprise, in particular, the application of a thin, conductive Cu layer by means of sputtering methods. In particular, the sputtering method may be carried out as a PVD or CVD method or by means of cathode sputtering.

The carriers foils according to the invention moreover, have a high average yield stress and better shrinkage behaviour, i.e. better dimensional stability, compared to the peeled foils, and this overall amounts to easier handling of the carrier foils according to the invention and a better product quality.

Moreover, with the peeled foils, a disadvantageous anisotropic behaviour is observed, which is avoided in the carrier foils produced according to the invention.

As an alternative to the Cu laminating methods described above, conventional laminating methods may be used, in which a Cu foil is connected by a multi-platen press to the carrier foil layer.

More advantageous, however, is a laminating method, in which the carrier foil layer and the Cu foil are continuously connected to one another by means of a double belt press. A so-called roll-to-roll production may be realised here, which works significantly more economically than the discontinuous method with the multiplaten press.

Finally, two or more layers of the carrier foil can be connected to one another in a conventional laminating method to form a laminate.

BRIEF DESCRIPTION OF THE DRAWING

FIG. 1 shows a preferred screw geometry for processing the polymer material used according to the present invention.

Production of a Carrier Foil from Thermoplastically Processable PTFE:

The use of special machine equipment is recommended for processing the fully fluorinated plastics materials to be used according to the invention by the extrusion method.

As, in the processing of fluorothermoplasts, hydrogen fluoride may occur, it is recommended that all the parts coming into contact with the melt be corrosion-resistant (for example made of Hastelloy C4 or Inconel 625).

In order, furthermore, to ensure optimal processing of the fluorothermoplasts, the use of a screw 10 with a design of the screw geometry as shown, for example, in FIG. 1 and described below, is recommended.

The screw 10 comprises a feed zone 12, a compression zone 14 and a metering zone 16.

The associated exemplary screw parameters are the following, with D designating the nominal diameter of the screw:

| | |
|---|---|
| Effective screw length | About 25 D |
| Length of the feed zone | About 13 to about 14 D |
| Length of the compression zone | About 5 to about 6 D |
| Length of the metering zone | About 5 to about 6 D |
| Pitch a | About 1 D |
| Ridge width b | About 0.1 D |
| Thread depth of the feed zone c | About 0.16 to about 0.18 D |
| Thread depth of the metering zone d | About 0.06 to about 0.07 D |
| Compression ratio | About 2.5 to about 2.7 |

A TFE copolymer with a copolymer content of 0.5 mol % is used as the polymer material. The comonomer was perfluoropropylvinylether (PPVE).

Flexible printed circuit boards, as will be briefly described by way of example below, can be produced from the carrier foils produced with the equipment described above, which may have, for example, a layer thickness of about 25 µm to about 500 µm. Although different technologies are suitable to apply a Cu lamination to the carrier foil according to the invention, the method described in WO 2005/084940 A1 is preferred. Adhesive-free printed circuit boards can be produced thereby, in particular.

The foil preferably produced by the chill roll method is firstly roughened by means of a special method already described above. The surface structure thus produced can also be otherwise described as "Nano-crag"-structured. According to this, a nanostructured, nanocomposite-containing transition layer is produced by an ion and/or plasma treatment step and preferably has an extent of the surface into the foil material of 2 µm or less. A metalising of the foil surface by means of copper takes place directly thereafter. This thin Cu layer, a so-called copper starting layer, is also called a Cu seed layer. Because of the above-described treatment, it forms a firm adhesive bond with the carrier foil.

A copper layer with a layer thickness which is desired for the respective application can then be applied, for example by means of chemical or electrochemical deposition, to the copper starting layer. Foils of this type with a Cu lamination are shown schematically in FIG. 3 of WO 2005/084940. Reference may be made here to the associated FIGURE description.

The invention claimed is:
1. Carrier foil for a flexible printed circuit board with multiple foil layers produced from a polymer material which comprises a thermoplastically processable TFE copolymer having a comonomer fraction of about 1 mol % or less, wherein one or more of the layers of the carrier foil is/are Cu laminated, and wherein the multiple layers of the carrier foil comprise chill rolled layers.

2. Carrier foil according to claim 1, wherein the comonomer fraction is about 0.5 mol % or less.

3. Carrier foil according to claim 1, wherein the comonomer is selected from hexafluoropropylene, perfluoroalkylvinylether, perfluoro-(2,2-dimethyl-1,3-dioxol) and/or chlorotrifluroethylene.

4. Carrier foil according to claim 3, wherein the comonomer is perfluoroalkylvinylether.

5. Carrier foil according to claim 4, wherein the perfluoroalkylvinylether is a perfluoropropylvinylether.

6. Carrier foil according to claim 1, wherein the Cu lamination is produced by means of electrodeposition.

7. Carrier foil according to claim 1, wherein the thickness of the Cu lamination is about 20 μm or less.

8. Carrier foil according to claim 7, wherein the thickness of the Cu lamination is about 12 μm or less.

9. Carrier foil according to claim 1, wherein the amorphous fraction of the TFE copolymer in the individual layers is about 50% by weight or more.

10. Carrier foil according to claim 1, wherein the arithmetic average roughness of a layer of the carrier foil on a first surface is about 1 μm or less and about 0.8 μm or less on the opposing surface (chill roll side).

11. Carrier foil according to claim 10, wherein the arithmetic average roughness of a layer of the carrier foil on a first surface is about 0.6 μm or less.

12. Carrier foil according to claim 9, wherein the arithmetic average roughness of the chill roll side is about 0.2 μm or less.

* * * * *